(12) United States Patent
Chen et al.

(10) Patent No.: US 7,123,899 B1
(45) Date of Patent: Oct. 17, 2006

(54) BROADBAND SINGLE-ENDED INPUT UPCONVERTER

(75) Inventors: Yung-Hue Chen, Banchiau (TW); Ting-Yuan Cheng, Hsinchu (TW); Keng-Li Su, Hsinchu (TW)

(73) Assignee: Industrial Technology Research Institute, Hsinchu (TW)

( * ) Notice: Subject to any disclaimer, the term of this patent is extended or adjusted under 35 U.S.C. 154(b) by 1005 days.

(21) Appl. No.: 09/656,172

(22) Filed: Sep. 6, 2000

(51) Int. Cl.
*H04B 1/26* (2006.01)
*H04B 1/04* (2006.01)
*H04B 1/16* (2006.01)
*H04B 1/18* (2006.01)

(52) U.S. Cl. .................. 455/341; 455/118; 455/194.2; 455/226.1; 455/293; 455/127.1

(58) Field of Classification Search ............... 455/118, 455/120, 128, 130, 137, 141, 143, 252.1, 455/127.4, 127.5, 139, 140, 161.1, 177.1, 455/200.1, 205, 216, 217, 242.2
See application file for complete search history.

(56) References Cited

U.S. PATENT DOCUMENTS

| | | | |
|---|---|---|---|
| 5,428,837 A | 6/1995 | Bayruns et al. ............. 455/317 |
| 5,465,420 A * | 11/1995 | Dougherty et al. ......... 455/333 |
| 5,563,545 A | 10/1996 | Scheinberg ................. 327/389 |
| 5,625,307 A | 4/1997 | Scheinberg ................. 327/113 |
| 5,774,017 A * | 6/1998 | Adar ............................ 330/51 |
| 6,442,374 B1 * | 8/2002 | Brady et al. ................... 455/73 |
| 6,529,721 B1 * | 3/2003 | Tiller ........................... 455/323 |
| 6,625,222 B1 * | 9/2003 | Bertonis et al. ............. 375/259 |
| 6,631,257 B1 * | 10/2003 | White et al. ................. 455/333 |

* cited by examiner

*Primary Examiner*—Edward F. Urban
*Assistant Examiner*—Thuan T. Nguyen
(74) *Attorney, Agent, or Firm*—Finnegan, Henderson, Farabow, Garrett & Dunner, L.L.P.

(57) ABSTRACT

An upconverter for mixing a single-ended RF signal with a differential local oscillator signal to generate a differential IF signal, that includes a source degenerated first differential pair comprising matched first and second transistors, each having source, gate and drain terminals, wherein the gate of the first transistor receives the input signal and the gate of the second transistor receives a ground potential, and a second differential pair comprising matched third and fourth transistors, each having source, gate and drain terminals, and a third differential pair comprising matched fifth and sixth transistors, each having source, gate and drain terminals, wherein the sources of the third and fourth transistors are coupled to the drain of the first transistor and the sources of the fifth and sixth transistors are coupled to the drain of the second transistor, the gate of the third transistor is coupled to the gate of the fifth transistor and the gate of the fourth transistor is coupled to the gate of the sixth transistor, the drain of the third transistor is coupled to the drain of the sixth transistor and the drain of the fourth transistor is coupled to the drain of the fifth transistor, the gates of the third and fourth transistors receive the differential local oscillator signal, the drains of the third and fourth transistors supply the differential IF signal, the gate of the first transistor is coupled to the single-ended RF signal, and the gate of the second transistor is coupled to a DC control signal.

31 Claims, 14 Drawing Sheets

BROADBAND SINGLE-ENDED INPUT UPCONVERTER

BACKGROUND OF THE INVENTION

1. Field of the Invention

The present invention pertains in general to a frequency conversion device, and more particularly, a single-ended upconverter.

2. Description of the Related Art

U.S. Pat. No. 5,625,307, to Scheinberg entitled, "Low Cost Monolithic GaAs Upconverter Chip" ("Scheinberg") describes an improvement upon a known frequency upconverter employing a Gilbert type double-balanced mixer. Scheinberg is hereby incorporated by reference.

A frequency upconverter generally includes an RF amplifier to amplify a radio frequency ("RF") input signal, a local oscillator ("LO") to generate a LO signal, and a mixer to combine the RF input and LO signals to generate an intermediate frequency ("IF") signal. FIG. 1 is a general block diagram of a known upconverter for double-conversion 102. Referring to FIG. 1, upconverter 102 includes a low-noise amplifier ("LNA") 104, a Gilbert type image-rejecting mixer 106, a phase splitter 110, a voltage-controlled oscillator ("VCO") 112 and a DC bias circuit 108. Upconverter 102 also includes sixteen pins, #1 to #16. Pin #6 receives an input signal RF and couples input signal RF to LNA 104, which, in turn, provides a differential output signal to mixer 106 to generate differential IF signals at ports #1 and #16. Differential IF signals have frequencies higher than that of the input RF signal.

FIG. 2 is a functional block diagram of LNA 104 and mixer 106 of FIG. 1. Referring to FIG. 2, input signal RF is transformed into a differential pair, $RF^+$ and $RF^-$, through an external capacitor-inductor-capacitor circuit 114. Differential pair $RF^+$ and $RF^-$ may also be created through an alternative embodiment of a Balun circuit 114A. LNA 104 receives differential pair $RF^+$ and $RF^-$ as input signals and provide output signals to mixer 106. Mixer 106 additionally receives differential signals LO to generate differential IF signals. Because LNA 104 requires differential-pair RF input signals, an external circuit, one such as Balun circuit 114, is always required. Such an external circuit is disadvantageous because it occupies additional chip area on a semiconductor wafer. FIG. 3 shows a schematic diagram of FIG. 2 as described in Scheinberg.

FIG. 4 is a functional block diagram of a conventional differential-pair input upconverter employing RF bypass networks. Referring to FIG. 4, an RF bypass network 116 is disposed between the input terminals of LNA 104 and differential-pair signals $RF^+$ and $RF^-$. RF bypass network 116 includes a first resistor 118, a second resistor 120, and a capacitor 122 connected in series. One end of capacitor 122 is coupled to resistor 120 and the other end of capacitor 122 is coupled to ground. RF bypass network 116 functions to dampen potential resonances of upconverter 102 created by bond wires (not shown) or the parasitic self-inductances of the package pins (not shown). However, RF bypass network 116 lacks preferred resistance matching at the input end of upconverter 102 and control of high-frequency image signals. FIG. 5 is a schematic diagram of FIG. 4.

FIG. 6 is a schematic diagram of a conventional differential-pair input upconverter including source degeneration networks. Referring to FIG. 6, LNA of upconverter 102 includes a first transistor 138, a second transistor 140, and a source degeneration network 124. Source degeneration network 124 includes matched source-degenerating inductors 126 and 128 and resistors 142 and 144 to eliminate noise created by transistors 138 and 140 and control image noise. Another embodiment of a source degeneration network is shown as 124A, including only source degenerating inductors. Although source degeneration resistors 142 and 144 improve the linearity of transistors 138 and 140 of LNA 104, source degeneration resistors 142 and 144 also decrease the gain of LNA 104. Similarly, although source degeneration inductors 126 and 128 inhibit image noise, inductors 126 and 128 do not provide for the linearity, conversion gain, or noise figure characteristics of LNA 104 or mixer 106.

Scheinberg additionally describes a DC bias circuit to address long power-up latencies in the order of several seconds, which cause an increased testing time. FIG. 7 is a schematic diagram of Scheinberg including a DC bias circuit that includes resistors 130, 132, and 134. A passive voltage-dividing network is shown in FIG. 7. The gate of transistor 136, which functions as a current source, is biased by the voltage-dividing network comprising resistor 130, 132, and 134, which act to prevent power-up latency. However, this design complicates the overall circuit design of upconverter 102.

Furthermore, when a upconverter chip is packaged, an external resonator is coupled to an internal VCO. The external resonator is grounded directly to an internal ground node of the upconverter chip or a ground node of the Printed Circuit Board (PCB). As a result, noise generated by the external resonator may be coupled to the internal VCO or other internal components of the upconverter through the common ground connection.

SUMMARY OF THE INVENTION

Accordingly, the present invention is directed to an improved upconverter that substantially obviates one or more problems due to limitations and disadvantages of the prior art.

Additional features and advantages of the invention will be set forth in the description which follows, and in part will be apparent from the description, or may be learned by practice of the invention. The objectives and other advantages of the invention will be realized and attained by the structures and methods particularly pointed out in the written description and claims thereof, as well as the appended drawings.

To achieve these and other advantages, and in accordance with the purpose of the invention as embodied and broadly described, there is provided an upconverter for modulating an input signal to provide an output signal having a higher frequency, which includes a mixer and an amplifier, coupled to the mixer, including a plurality of transistors and having a first input terminal for receiving the input signal and a second input terminal for receiving a DC power control signal of a predetermined level, wherein the DC power control signal turns off the transistors of the amplifier when the predetermined level is between approximately −1 to −2 volts.

In one aspect of the invention, the upconverter further includes a source degenerating inductor circuit including a first inductor in parallel with a second inductor and a third inductor thereby forming a "Y"-shaped circuit, wherein the first inductor has a higher inductance than the second and third inductors.

In another aspect of the invention, the upconverter further includes a DC bias network for biasing the mixer and reducing power-up latency in the upconverter including a voltage dividing network coupled to the second input terminal of the amplifier.

In yet another aspect of the invention, wherein the DC bias network comprises first, second, third, and fourth resistors, the first resistor and third resistor receive a differential LO signal and the first resistor is in parallel with the second resistor, the third resistor, and the fourth resistor.

In still another aspect of the invention, the upconverter additionally includes a plurality of serially connected diodes coupled to the first input terminal of the amplifier for electrostatic discharge protection.

Also in accordance with the present invention, there is provided an upconverter for modulating an input signal to provide an output signal having a higher frequency that includes a mixer and an amplifier, coupled to the mixer, including matched first and second MESFETs, each MESFET having source, gate, drain terminals, wherein the gate of the first MESFET receives the input signal, and the gate of the second MESFET is coupled to a DC control voltage capable of turning off the first and second MESFETs.

Additionally in accordance with the present invention, there is provided an upconverter for modulating an input signal to provide an output signal having a higher frequency, the input signal including an image signal, which upconverter includes a mixer, an amplifier, coupled to the mixer circuit, including a first input terminal for receiving the input signal, a second input terminal coupled to ground, and a filter for rejecting noise signals having a same frequency as the image signal of the input signal, and a first resistor having a first end coupled to the first input terminal of the amplifier and a second end coupled to ground.

In one aspect of the invention, the amplifier comprises matched first and second MESFETs, each MESFET having source, gate, and drain terminals, wherein the gate of the first MESFET receives an input signal and is coupled to one end of a filter, and the gate of the second MESFET is coupled to ground and a second end of the filter.

In another aspect of the invention, the mixer comprises matched third and fourth MESFETs, each having source, gate and drain terminals, and matched fifth and sixth MESFETs, each having source, gate and drain terminals, wherein the sources of the third and fourth MESFETs are coupled to the drain of the first MESFET and the sources of the fifth and sixth MESFETs are coupled to the drain of the second MESFET, the gate of the third MESFET is coupled to the gate of the sixth MESFET and the gate of the fourth MESFET is coupled to the gate of the fifth MESFET, the gates of the third and fourth MESFETs receive a differential LO signal, the drain of the third MESFET is coupled to the drain of the fifth MESFET and the drain of the fourth MESFET is coupled to the drain of the sixth MESFET, and the drains of the third and fourth MESFETs provide an IF output signal.

Further in accordance with the present invention, there is provided an upconverter for modulating an input signal to provide an output signal having a higher frequency, which includes a mixer, an amplifier coupled to the mixer, having a first input terminal for receiving the input signal and a second input terminal for receiving a DC power control signal, and a DC bias network for biasing the mixer and reducing power-up latency in the upconverter including a voltage dividing network coupled to the second input terminal of the amplifier and a resistive network coupled to the amplifier.

Also in accordance with the present invention, there is provided an upconverter for mixing a single-ended RF signal with a differential LO signal to generate a differential IF signal that includes a source degenerated first differential pair comprising matched first and second transistors, each having source, gate and drain terminals, wherein the gate of the first transistor receives an input signal and the gate of the second transistor is connected to a ground potential, and a second differential pair comprising matched third and fourth transistors, each having source, gate and drain terminals, and a third differential pair comprising matched fifth and sixth transistors, each having source, gate and drain terminals, wherein the sources of the third and fourth transistors are coupled to the drain of the first transistor and the sources of the fifth and sixth transistors are coupled to the drain of the second transistor, the gate of the third transistor is coupled to the gate of the fifth transistor and the gate of the fourth transistor is coupled to the gate of the sixth transistor, the drain of the third transistor is coupled to the drain of the sixth transistor and the drain of the fourth transistor is coupled to the drain of the fifth transistor, the gates of the third and fourth transistors receive the differential LO signal, the drains of the third and fourth transistors supply the differential IF signal, the gate of the first transistor is coupled to the single-ended RF signal, and the gate of the second transistor is coupled to a DC control signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are incorporated in and constitute a part of this specification, illustrate embodiments of the invention and, together with the description, serve to explain the objects, advantages, and principles of the invention.

In the drawings.

DETAILED DESCRIPTION OF THE PREFERRED EMBODIMENTS

Figure 1:
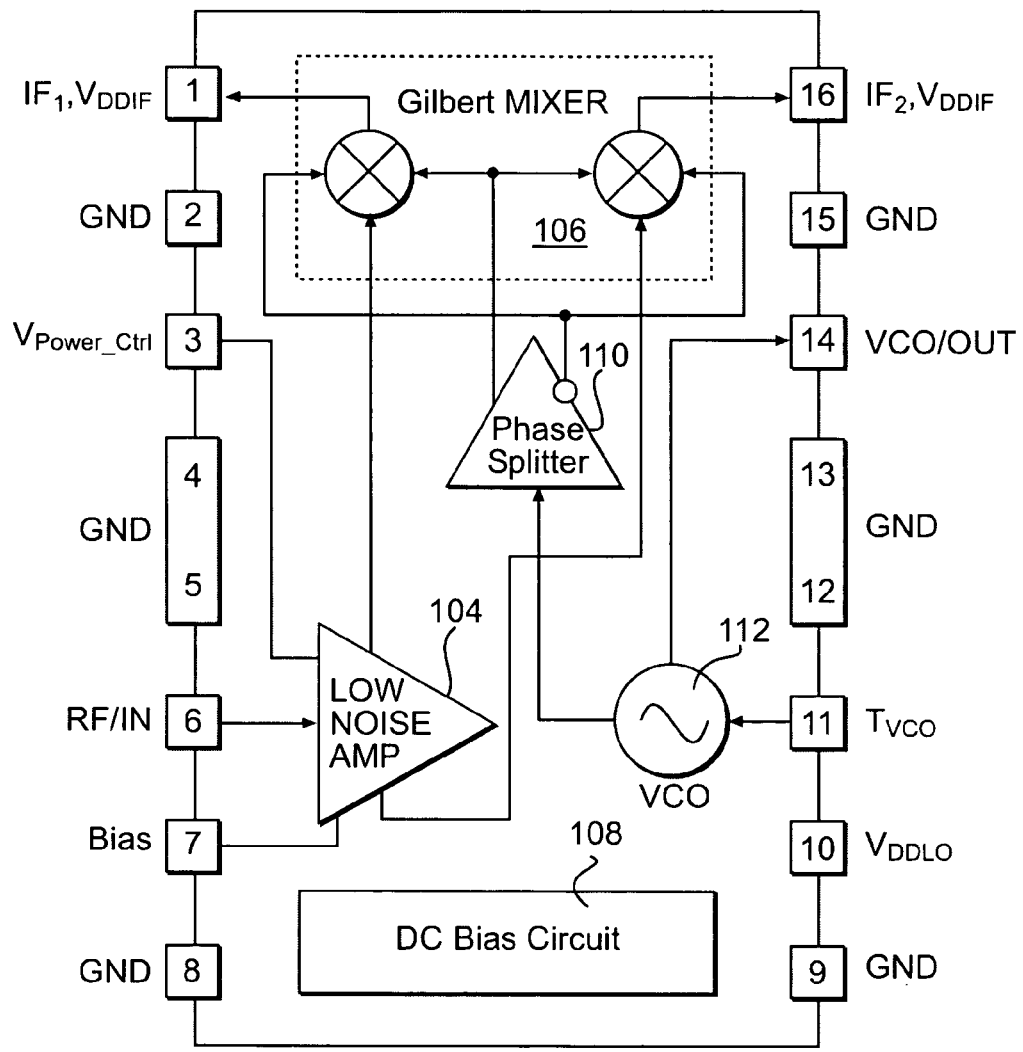
FIG. 1 is a block diagram of a conventional upconverter.
Figure 2:
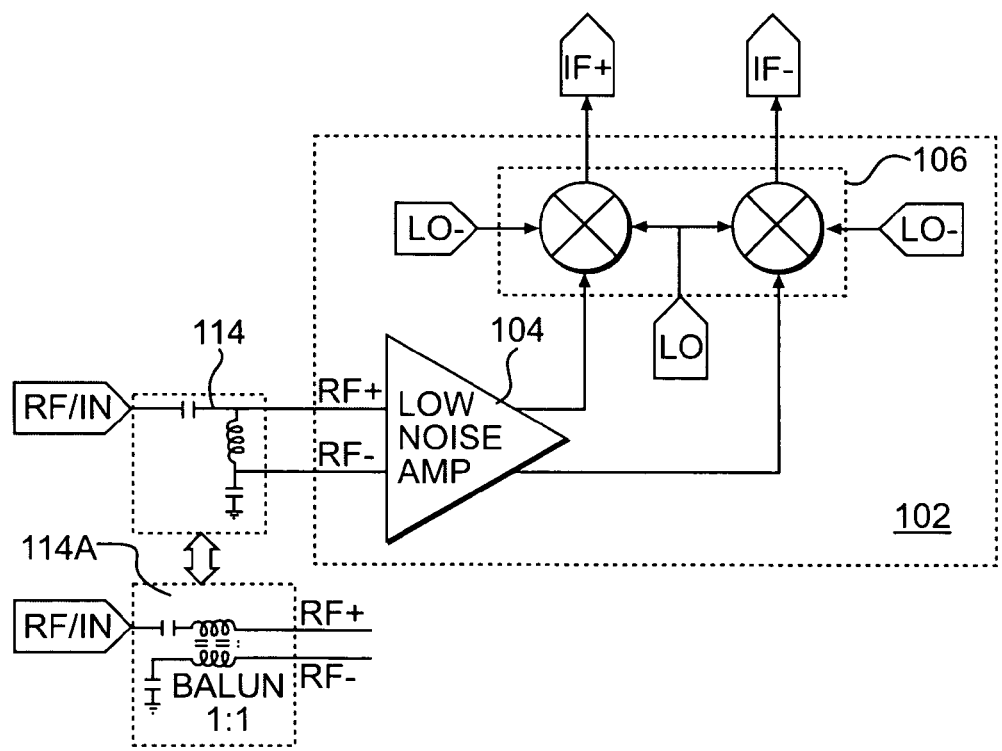
FIG. 2 is a functional block diagram of a conventional differential-pair input upconverter.
Figure 3:
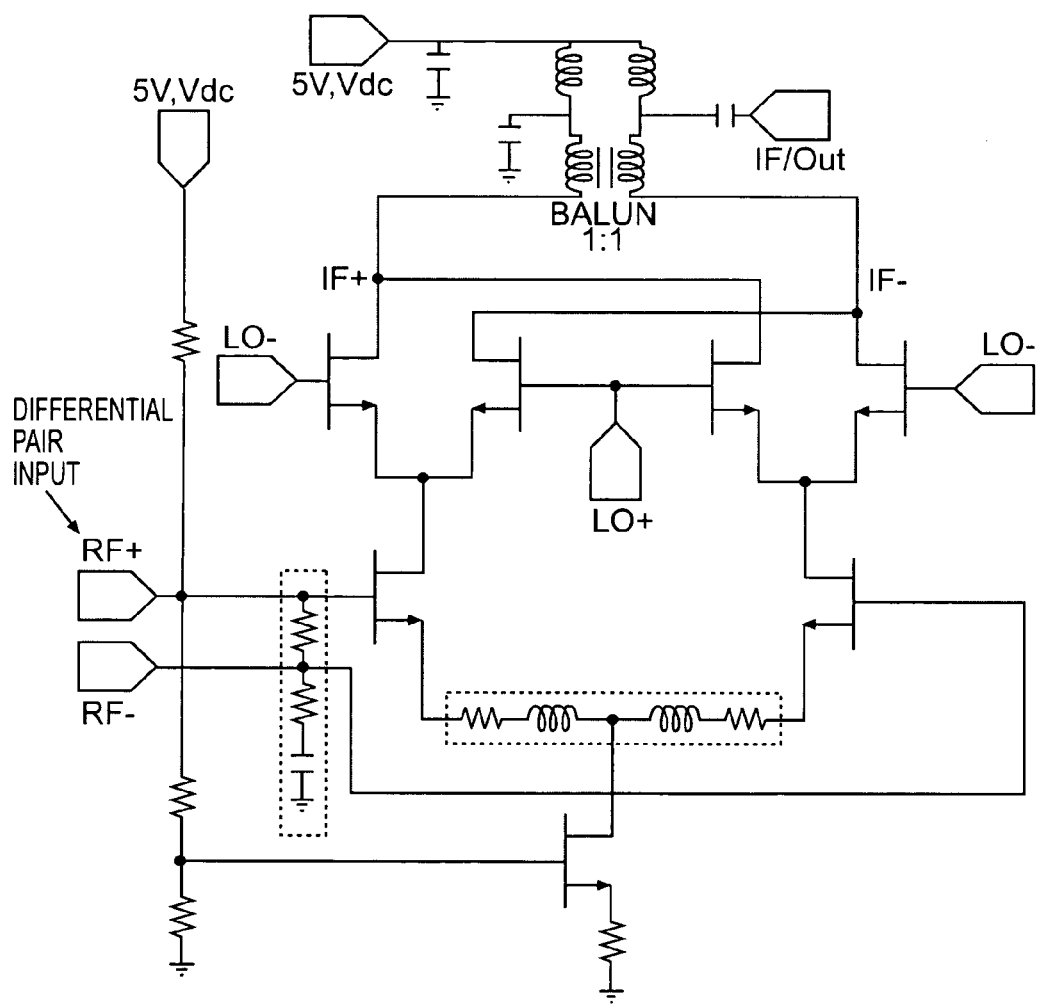
FIG. 3 is a schematic diagram of FIG. 2.
Figure 4:
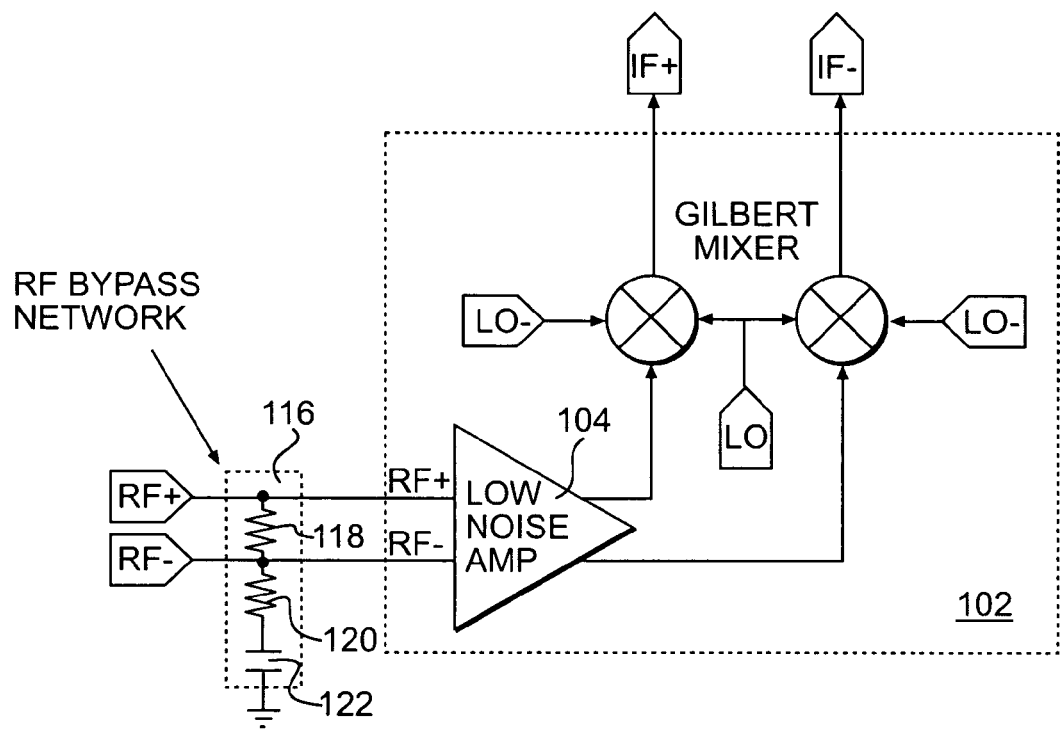
FIG. 4 is a functional block diagram of a conventional differential-pair input upconverter including a RF bypass network.
Figure 5:
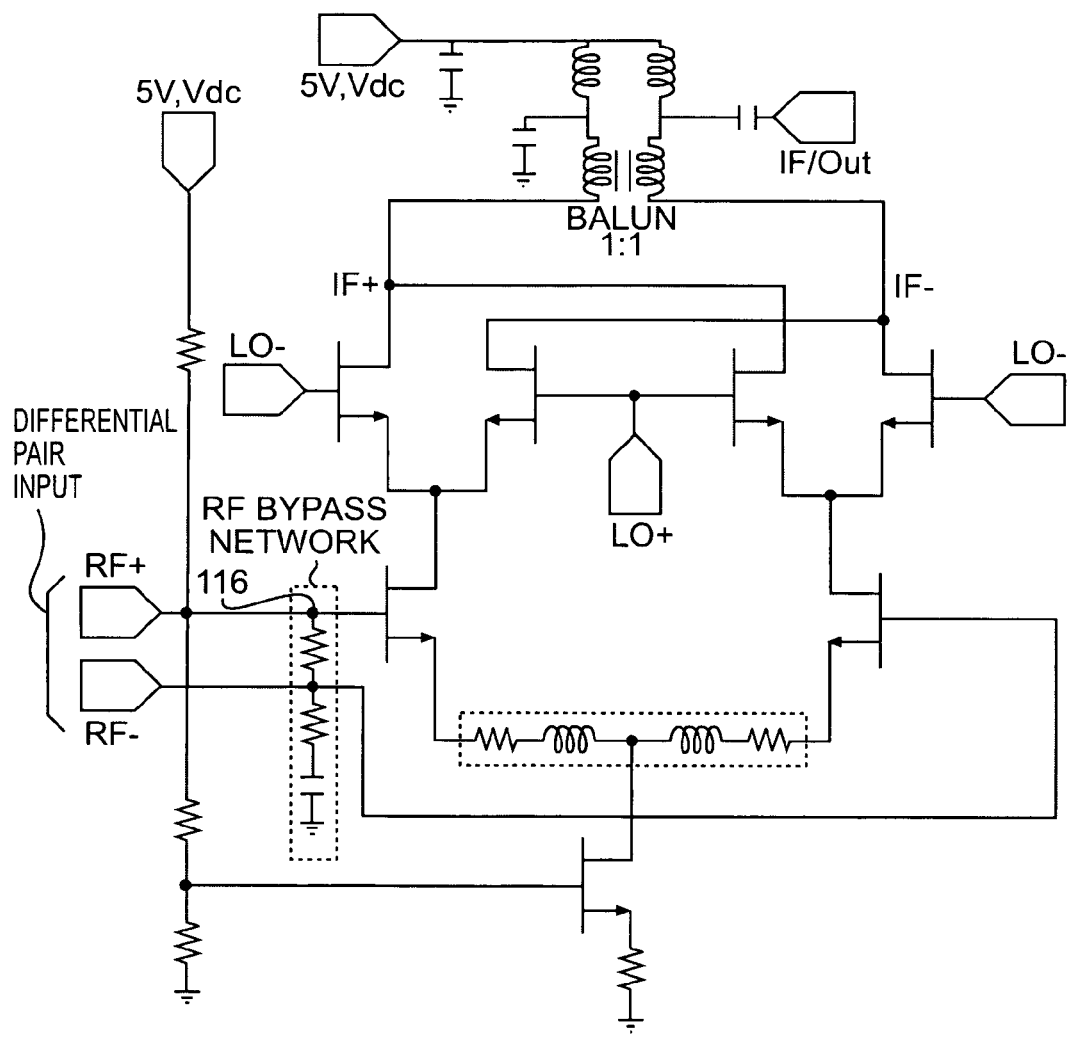
FIG. 5 is a schematic diagram of FIG. 6.
Figure 6:
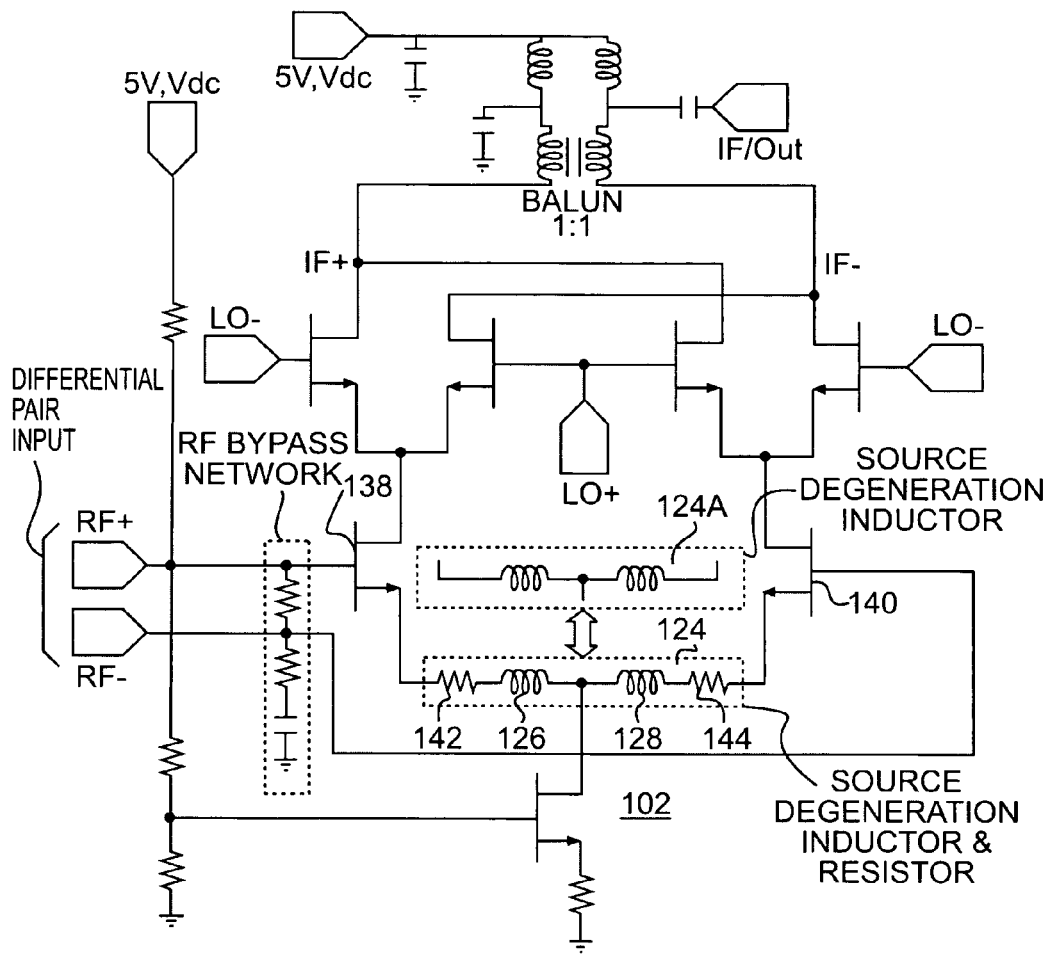
FIG. 6 is a schematic diagram of a conventional differential-pair input upconverter including source degeneration networks.
Figure 7:
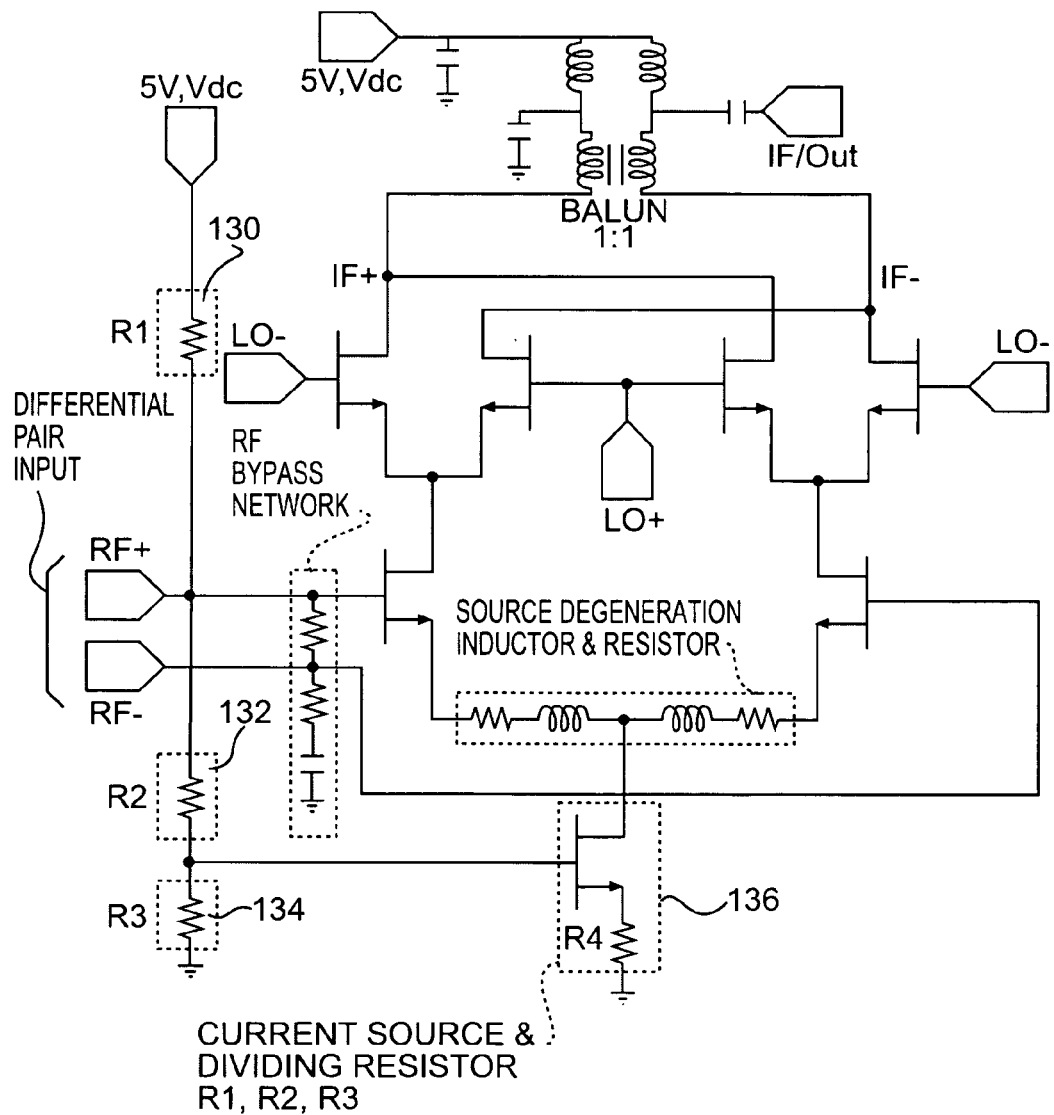
FIG. 7 is a schematic diagram of a conventional differential-pair input upconverter including a DC bias circuit.
Figure 8:
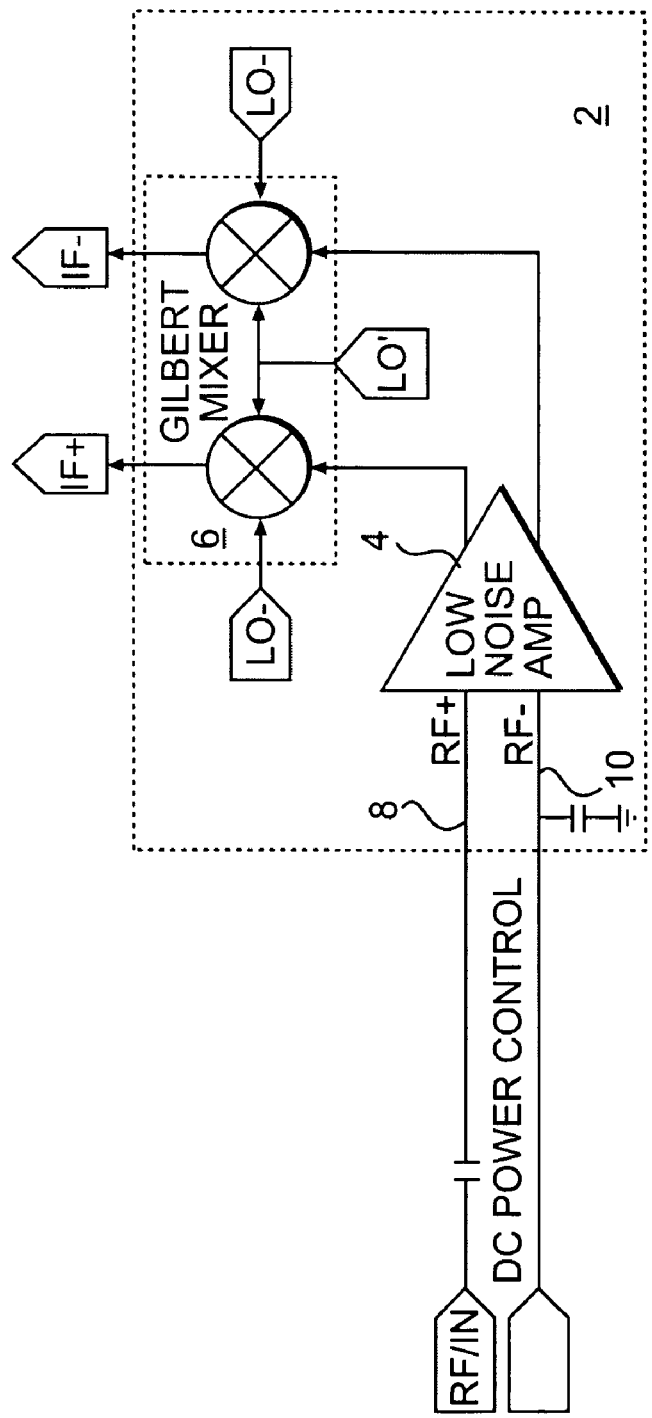
FIG. 8 is a functional block diagram of one embodiment of the present invention.

FIG. 8 is a functional block diagram of one embodiment of the present invention. Referring to FIG. 8, an upconverter 2 includes a low noise amplifier ("LNA") 4 coupled to a Gilbert-type mixer 6. LNA 4 includes a first input terminal 8 and a second input terminal 10. First input terminal 8 receives a single-ended input RF signal and second input terminal 10 receives a DC power control signal of a predetermined level. A single-ended RF input obviates the need for an external balun circuit to create differential pair RF signals. A single-ended upconverter is advantageous over a differential-pair upconverter in cost and simplicity of circuit design.

Mixer 6 receives input signals from LNA 4 and differential signals from LO to generate differential-pair output signals IF. In one embodiment of the invention, the DC power control signal turns off LNA 4 when the predetermined level is, for example, between approximately −1 to −2 volts. LNA 4 may be optionally turned off by the DC power control signal such that mixer 6 will not generate any differential-pair output signals thereby achieving output power control. When upconverter 2 is in operation, the DC power control signal is turned off.

Figure 9:
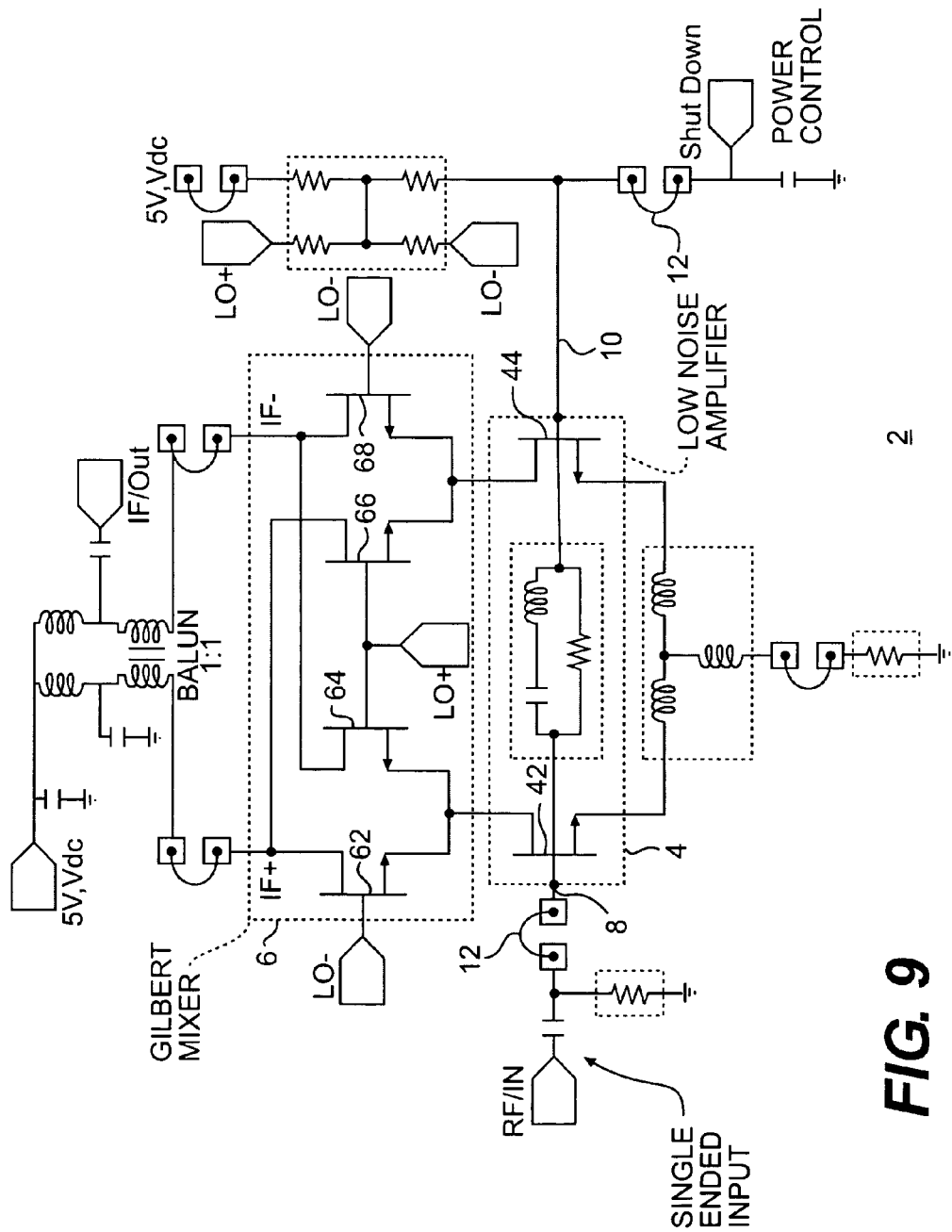
FIG. 9 is a schematic diagram of FIG. 8.

FIG. 9 is a schematic diagram of FIG. 8. Referring to FIG. 9, LNA 4 includes transistors 42 and 44 and a mixer 6 including transistors 62, 64, 66 and 68. Each of transistors 42, 44, 62, 64, 66 and 68 may be a metal semiconductor field effect transistor ("MESFET"). In one embodiment of the present invention, transistors 42 and 44, transistors 62 and 64, and transistors 66 and 68, are each matched transistor pairs. The gate of transistor 42 is provided as first input terminal 8 of LNA 4, and the gate of transistor 44 is provided as second input terminal 10 of LNA 4. The drain of transistor 42 is coupled to the source of transistor 62 and the source of transistor 64. The drain of transistor 44 is coupled to the source of transistor 66 and transistor 68. The gates of transistors 62 and 68 receive a differential LO⁻ signal, and the gates of transistor 64 and 66 receive a differential LO⁺ signal. The drain of transistor 62 is coupled to the drain of transistor 66 to provide differential output signal IF⁺. The drain of transistor 68 is coupled to the drain of 64 to provide differential output signal IF⁻.

First input terminal 8 and second input terminal 10 are each coupled to a bond wire 12. First input terminal 8 receives a single-ended RF input signal through bond wire 12. Second input terminal 10 receives a DC power control signal through bond wire 12. In one embodiment of the present invention, the DC power control signal turns off transistors 42 and 44 when the predetermined DC power control signal level is between, for example, approximately −1 to −2 volts.

Figure 10:
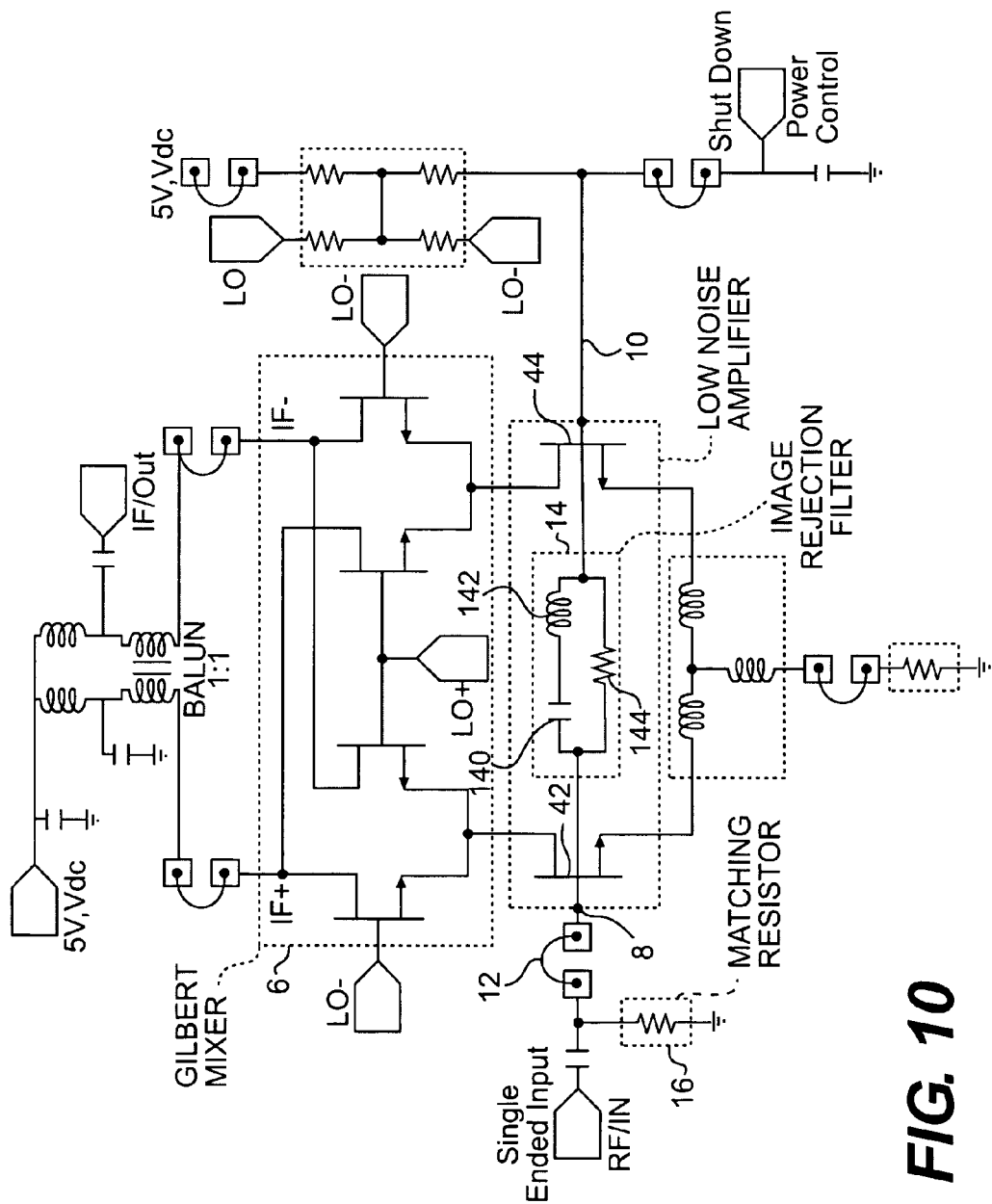
FIG. 10 is a schematic diagram of another embodiment of the present invention including an image rejection filter and a matching resistor.

FIG. 10 is a schematic diagram of another embodiment of the present invention in which LNA 4 includes transistor 42, transistor 44, and an image rejection filter 14 to reject noise signals having the same frequency as the image signal of the input RF signal. Referring to FIG. 10, image rejection filter 14 is coupled at one end to the gate of transistor 42 and coupled at the other end to the gate of transistor 44. In one embodiment, image rejection filter 14 is a low-pass filter and includes a capacitor 140 connected in series with an inductor 142, and the capacitor-inductor pair is parallel with resistor 144. In operation, image rejection filter 14 filters out image harmonics to improve image rejection and acts as a noise filter.

FIG. 10 further includes a matching resistor 16 coupled at one end to the gate of transistor 42 through bond wired 12 and coupled to ground at the other end to reject potential resonances of upconverter 2 created by bond wires or parasitic self-inductances of the package pins at first input terminal 8. Resistor 16 matches the input impedance with that of the upconverter, and the value of which depends on upconverter characteristics. The matching resistor may be implemented as a matching impedance to improve performance. The image rejection filter and matching resistor provide an improved resistance matching and image signal control.

Figure 11:
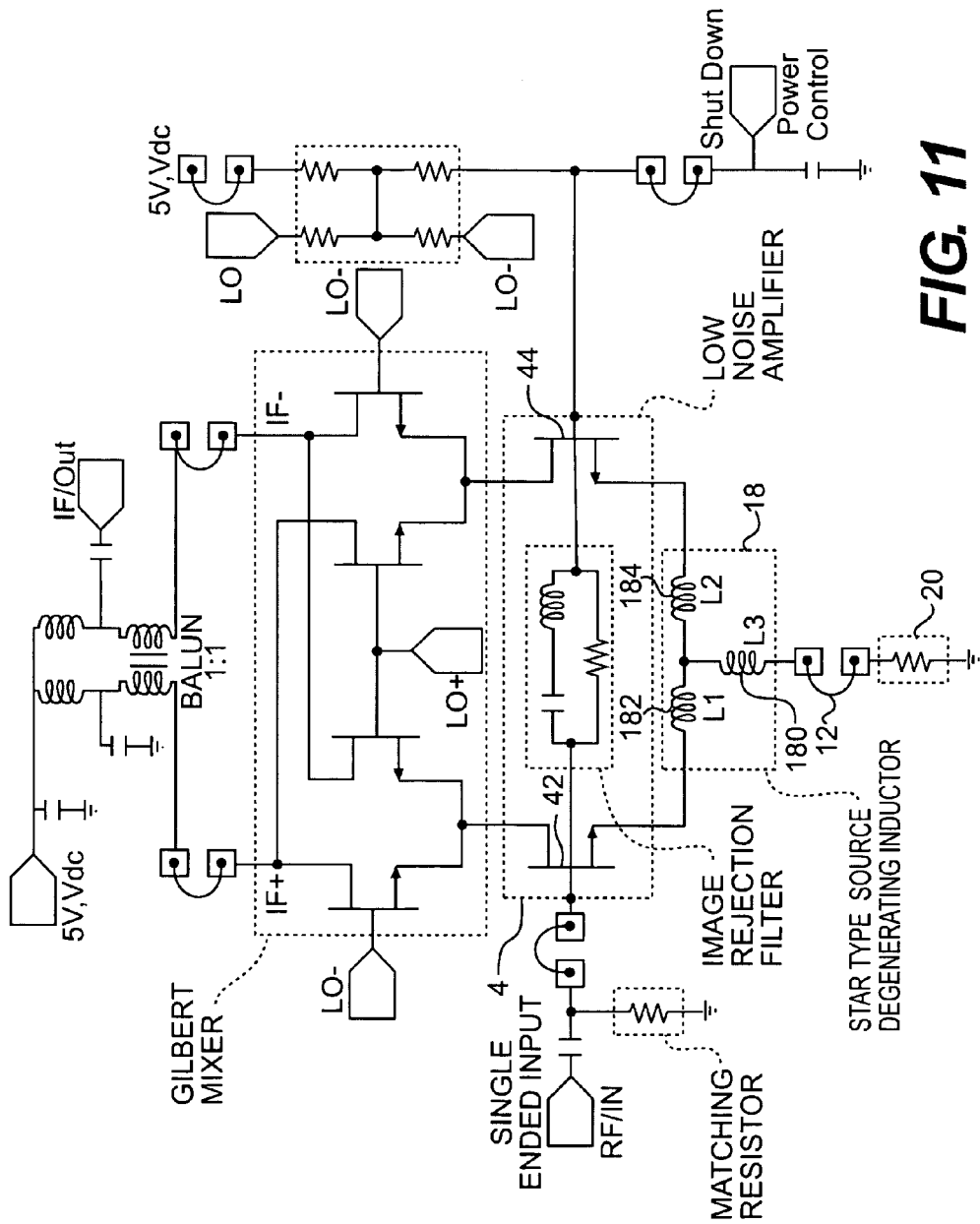
FIG. 11 is a schematic diagram of one embodiment of the present invention that includes a source degenerating circuit.

FIG. 11 is a schematic diagram of one embodiment of the present invention that includes a source degenerating circuit 18 coupled to LNA 4. Source degenerating circuit 18 is coupled at one end to the source of transistor 42 and at the other end to the source of transistor 44 of LNA 4. Source degenerating circuit 18 includes a first inductor 180 coupled in parallel with a second inductor 182 and a third inductor 184, thereby forming a "Y"-shaped circuit. First inductor 180 is coupled to ground through bond wire 12. In one embodiment of the present invention, a resistor 20 is disposed between bond wire 12 and ground. In another embodiment of the present invention, first inductor 180 has a higher inductance than second inductor 182 and third inductor 184. In one embodiment of the invention, inductor 180 has a value six times as great as that of inductor 182. Similarly, inductor 180 has a value six time as great as that of inductor 184.

In operation, second inductor 182 and third inductor 184 together act as a high-pass filter to substantially eliminate high frequency image noise. First inductor 180 is a low-pass filter that substantially eliminates input noises coupled through from the ground connection. Source degeneration circuit 18 of the present invention eliminates noise to improve linearity of LNA 4 and mixer 6, and at the same time, preserves the gain and noise figure characteristics of LNA 4.

Figure 12:
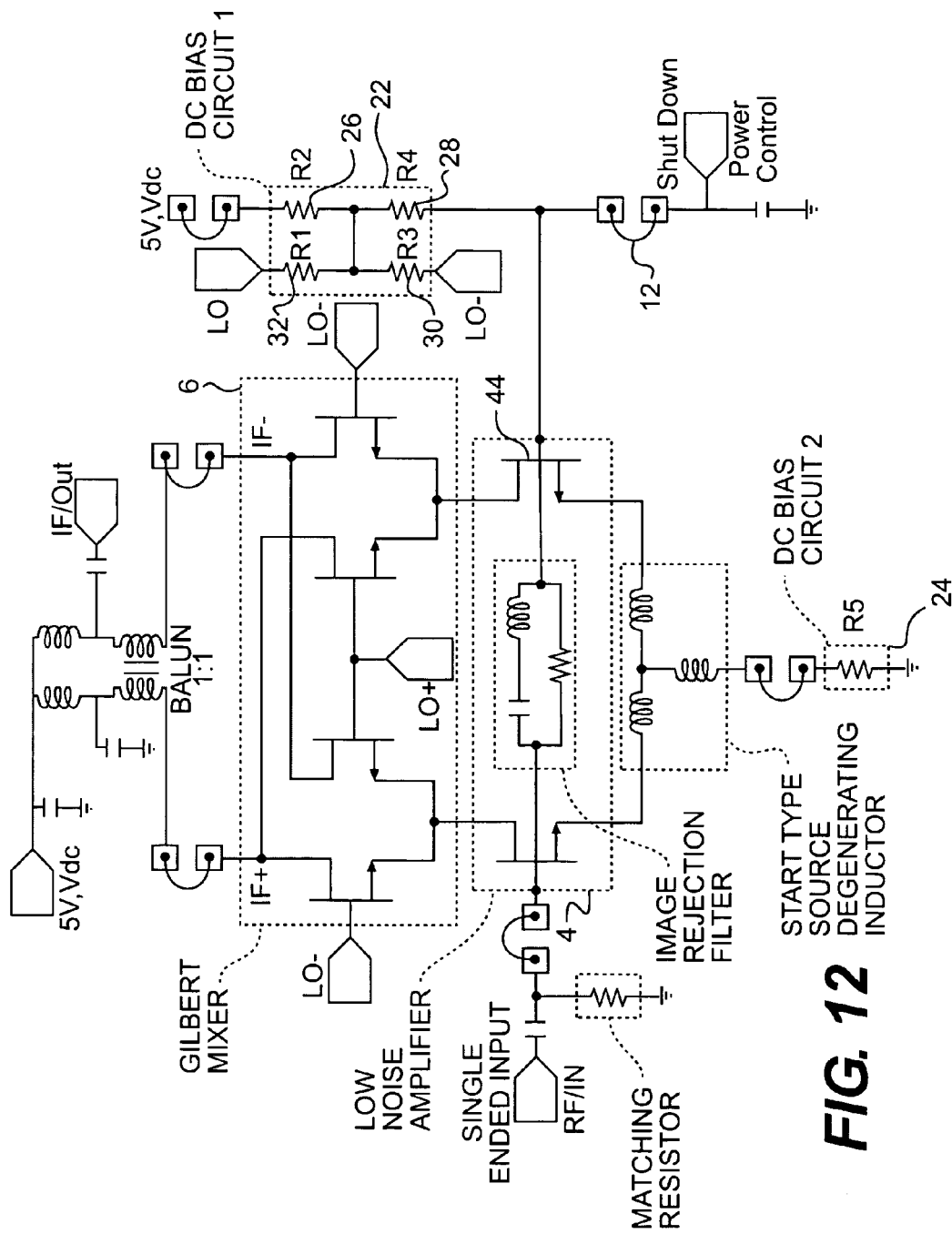
FIG. 12 is a schematic diagram of one embodiment of the present invention that includes a DC bias circuit.

FIG. 12 is a schematic diagram of one embodiment of the present invention that includes a DC bias circuit. Referring to FIG. 12, there includes an internal DC bias circuit 22 and an external DC bias circuit 24. Internal DC bias circuit 22 is coupled at one end to a voltage source $V_{dc}$. DC bias circuit 22 is coupled at the other end to the gate of transistor 44 of LNA 4 and the DC power control signal through bond wire 12. DC bias circuit 22 comprises a voltage dividing network including a plurality of resistors 26, 28, 30, and 32, to provide the voltages requires by LNA 4 and mixer 6. Resistor 32 is in parallel with resistors 30, 26 and 28. Resistor 32 receives differential LO⁺ signal and resistor 30 receives differential LO⁻ signal. Resistor 26 receives a DC voltage through bond wire 12, and resistor 28 is coupled at one end to the gate of transistor 44 and the DC power control signal through bond wire 12. External DC bias circuit 24 adjusts the conversion gain, linearity and DC current of LNA 4. This embodiment of the present invention provides a simplified circuit to prevent power-up latency.

Figure 13:
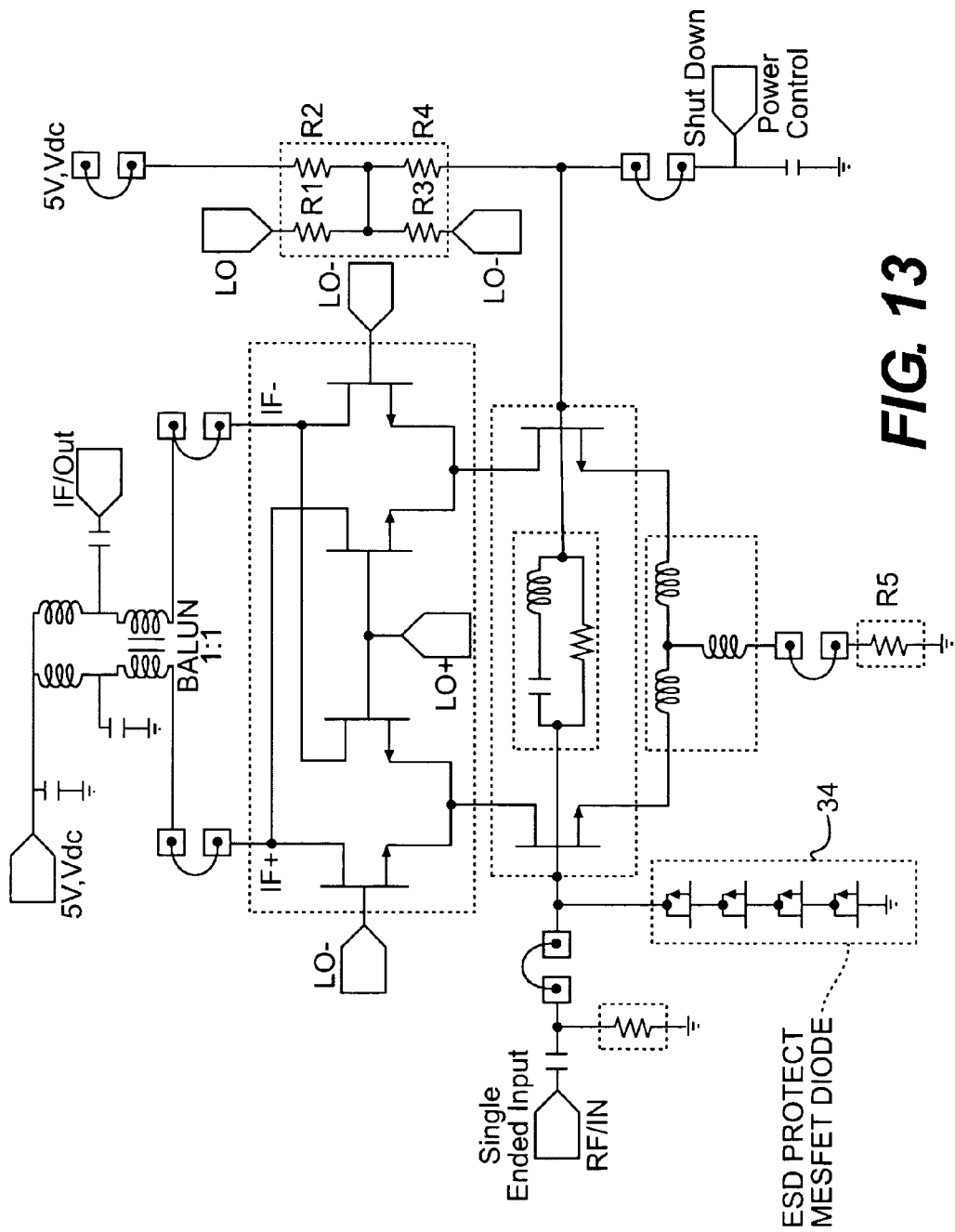
FIG. 13 is a schematic diagram of one embodiment of the present invention that includes an electrostatic discharge protection circuit.

FIG. 13 is a schematic diagram of one embodiment of the present invention that includes an electrostatic discharge ("ESD") protection circuit 34. Referring to FIG. 13, ESD protection circuit includes a plurality of diode-connected transistors. In one embodiment, as shown in FIG. 13, four diode-connected transistors are able to withstand an ESD discharge of more than −2 kV. In one embodiment of the invention, each of diode-connected transistor has a bias voltage of 0.7 volts.

Figure 14:
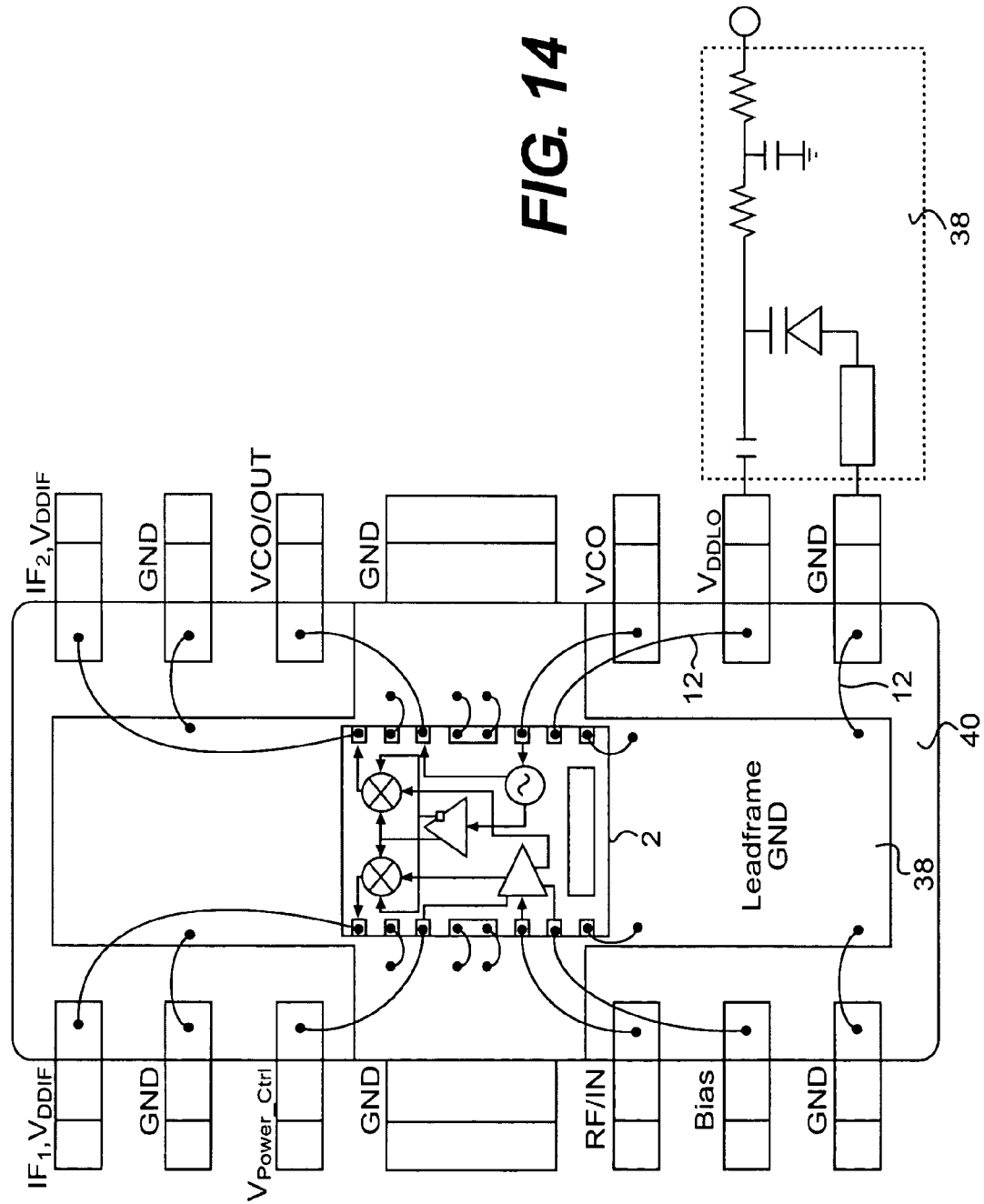
FIG. 14 is a block diagram of a packaged upconverter chip according to the present invention.

FIG. 14 is a block diagram of a packaged upconverter chip of the present invention. Referring to FIG. 14, an upconverter chip (not numbered) include packaging 40, a leadframe 38 disposed over packaging 40, a semiconductor die containing an upconverter 2 disposed over leadframe 38, and a plurality of packaging pins. An external resonator circuit 36 is coupled to a GND pin and $V_{DDLO}$ pin of the upconverter chip, which includes a plurality of ground (GND) pins. Each of the plurality of GND pins is coupled to leadframe 38 through bond wires 12. Leadframe 38 absorbs noises generated by external resonator circuit 36 to prevent the noise from being coupled to any components of upconverter.

It will be apparent to those skilled in the art that various modifications and variations can be made in the disclosed product without departing from the scope or spirit of the invention. Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. An upconverter for modulating an input signal to provide an output signal having a higher frequency than the input signal, comprising:
    a mixer; and
    an amplifier coupled to the mixer, including a plurality of transistors and having a first input terminal for receiving the input signal and a second input terminal for receiving a DC power control signal of a predetermined level, wherein the DC power control signal controls differential pair output signals provided by the mixer.

2. The upconverter as claimed in claim 1 further comprising a source degenerating inductor circuit including a first inductor in parallel with a second inductor and a third inductor, wherein the first inductor has a higher inductance than each of the second inductor and the third inductor.

3. The upconverter as claimed in claim 1 further comprising a DC bias network for biasing the mixer and reducing power-up latency in the upconverter including a voltage dividing network coupled to the second input terminal of the amplifier.

4. The upconverter as claimed in claim 3, wherein the DC bias network comprises a first resistor, a second resistor, a third resistor, and a fourth resistor, the first resistor and third resistor receiving a differential local oscillator signal and the first resistor being in parallel with each of the second resistor, the third resistor, and the fourth resistor.

5. The upconverter as claimed in claim 1 further comprising a plurality of serially connected diodes coupled to the first input terminal of the amplifier for electro-static discharge protection.

6. The upconverter as claimed in claim 5, wherein the plurality of serially connected diodes comprises a plurality of diode-connected transistors.

7. An upconverter for modulating an input signal to provide an output signal having a higher frequency than the input signal, comprising:
    a mixer; and
    an amplifier, coupled to the mixer, including matched first and second MESFETs, each MESFET having source, gate, and drain terminals, wherein the gate of the first MESFET receives the input signal, and the gate of the second MESFET is coupled to a DC control voltage capable of turning off the first and second MESFETs.

8. The upconverter as claimed in claim 7 further comprising a plurality of diode-connected MESFETs to protect the upconverter from electro-static discharge.

9. The upconverter as claimed in claim 7 further comprising a source degenerating inductor circuit coupled to the amplifier to reduce noise.

10. The upconverter as claimed in claim 9, wherein the source degenerating inductor circuit comprises a first inductor coupled in parallel with a second inductor and a third inductor.

11. The upconverter as claimed in claim 10, wherein the first inductor has a higher inductance than each of the second inductor and the third inductor.

12. The upconverter as claimed in claim 7 further comprising a DC bias network for biasing the mixer and reducing power-up latency in the upconverter including a voltage dividing network coupled to the second input terminal of the amplifier.

13. An upconverter for modulating an input signal to provide an output signal having a higher frequency, the input signal including an image signal, comprising:
    a mixer;
    an amplifier, coupled to the mixer circuit, including
        a first input terminal for receiving the input signal,
        a second input terminal coupled to ground, and
        a filter for rejecting noise signals having a same frequency as the image signal of the input signal; and
    a first resistor having a first end coupled to the first input terminal of the amplifier and a second end coupled to ground.

14. The upconverter as claimed in claim 13, wherein the filter comprises a second resistor having a same resistance as the first resistor.

15. The upconverter as claimed in claim 13, wherein the filter comprises a resistor in parallel with a serial capacitor and inductor pair.

16. The upconverter as claimed in claim 13, wherein the amplifier comprises matched first and second MESFETs, each MESFET having source, gate, and drain terminals, wherein the gate of the first MESFET receives the input signal and is coupled to one end of the filter, and the gate of the second MESFET is coupled to ground and a second end of the filter.

17. The upconverter as claimed in claim 16, wherein the mixer comprises matched third and fourth MESFETs, each having source, gate and drain terminals, and matched fifth and sixth MESFETs, each having source, gate and drain terminals,
    wherein the sources of the third and fourth MESFETs are coupled to the drain of the first MESFET and the sources of the fifth and sixth MESFETs are coupled to the drain of the second MESFET,
    the gate of the third MESFET is coupled to the gate of the sixth MESFET and the gate of the fourth MESFET is coupled to the gate of the fifth MESFET,
    the gates of the third and fourth MESFETs receive a differential local oscillator signal,
    the drain of the third MESFET is coupled to the drain of the fifth MESFET and the drain of the fourth MESFET is coupled to the drain of the sixth MESFET, and
    the drains of the third and fourth MESFETs providing an IF output signal.

18. The upconverter as claimed in claim 13 further comprising a DC bias network for biasing the mixer and reducing power-up latency in the upconverter including a voltage dividing network coupled to the second input terminal of the amplifier.

19. The upconverter as claimed in claim 13 further comprising a plurality of diode-connected MESFETs to protect the upconverter from electro-static discharge.

20. An upconverter for modulating an input signal to provide an output signal having a higher frequency than the input signal, comprising:
   a mixer;
   an amplifier, coupled to the mixer, having a first input terminal for receiving the input signal and a second input terminal for receiving a DC power control signal; and
   a source degenerating inductor circuit coupled to the amplifier to reduce image noise;
   wherein the DC power control signal controls differential pair output signals provided by the mixer.

21. The upconverter as claimed in claim 20, wherein the DC control voltage coupled to the second terminal of the mixer turns off the amplifier when the DC control voltage is at a predetermined voltage level.

22. The upconverter as claimed in claim 21, wherein the predetermined voltage level of the DC power control signal is between approximately −1 to −2 volts.

23. The upconverter as claimed in claim 20, wherein the source degenerating inductor circuit comprises a first inductor in parallel with a second inductor and a third inductor.

24. The upconverter as claimed in claim 23, wherein the first inductor has a higher inductance than each of the second inductor and the third inductor.

25. The upconverter as claimed in claim 20 further comprising a DC bias network for biasing the mixer and reducing power-up latency in the upconverter including a voltage dividing network coupled to the second input terminal of the amplifier.

26. The upconverter as claimed in claim 25, wherein the DC bias network comprises a first resistor, a second resistor, a third resistor, and a fourth resistor, the first resistor and third resistor receiving a differential local oscillator signal and the first resistor being in parallel with the second resistor, the third resistor, and the fourth resistor.

27. The upconverter as claimed in claim 20 further comprising a plurality of serially connected diodes coupled to the first input terminal of the amplifier to protect the upconverter from electro-static discharge.

28. The upconverter as claimed in claim 27, wherein the plurality of serially connected diodes comprise a plurality of diode-connected MESFETs.

29. An upconverter for modulating an input signal to provide an output signal having a higher frequency, comprising:
   a mixer;
   an amplifier, coupled to the mixer, having a first input terminal for receiving the input signal and a second input terminal for receiving a DC power control signal; and
   a DC bias network for biasing the mixer and reducing power-up latency in the upconverter including a voltage dividing network coupled to the second input terminal of the amplifier and a resistive network coupled to the amplifier;
   wherein the DC power control signal controls differential pair output signals provided by the mixer.

30. The upconverter as claimed in claim 29, wherein the DC bias network comprises a first resistor, a second resistor, a third resistor, and a fourth resistor, the first resistor and third resistor receiving a differential local oscillator signal and the first resistor being in parallel with the second resistor, the third resistor, and the fourth resistor.

31. An upconverter for modulating an input signal to provide an output signal having a higher frequency, comprising:
   a mixer;
   an amplifier, coupled to the mixer, having a first input terminal for receiving the input signal and a second input terminal for receiving a DC power control signal; and
   a plurality of serially connected diode-connected MESFETs coupled to the first input terminal of the amplifier for prevention of electrostatic discharge;
   wherein the DC power control signal controls differential pair output signals provided by the mixer.

* * * * *

UNITED STATES PATENT AND TRADEMARK OFFICE
CERTIFICATE OF CORRECTION

PATENT NO. : 7,123,899 B1
APPLICATION NO. : 09/656172
DATED : October 17, 2006
INVENTOR(S) : Yung-Hui Chen et al.

It is certified that error appears in the above-identified patent and that said Letters Patent is hereby corrected as shown below:

Title page, item (75), "Yung-Hue" should read --Yung-Hui--.

Claim 31, column 10, line 37, "electrostatic" should read --electro-static--.

Signed and Sealed this

Thirteenth Day of March, 2007

JON W. DUDAS
*Director of the United States Patent and Trademark Office*